US012787514B2

(12) United States Patent
Zhou

(10) Patent No.: US 12,787,514 B2
(45) Date of Patent: Nov. 3, 2026

(54) DISPLAY PANEL HAVING TWO STACKED BARRIER WALLS AND MANUFACTURING METHOD THEREOF AND SPLICING DISPLAY SCREEN

(71) Applicant: Guangzhou China Star Optoelectronics Semiconductor Display Technology Co., LTD., Guangzhou (CN)

(72) Inventor: Xiaobo Zhou, Guangzhou (CN)

(73) Assignee: Guangzhou China Star Optoelectronics Semiconductor Display Technology Co., Ltd., Guangzhou (CN)

(*) Notice: Subject to any disclaimer, the term of this patent is extended or adjusted under 35 U.S.C. 154(b) by 398 days.

(21) Appl. No.: 18/520,802

(22) Filed: Nov. 28, 2023

(65) Prior Publication Data

US 2024/0355970 A1 Oct. 24, 2024

(30) Foreign Application Priority Data

Apr. 20, 2023 (CN) ......................... 202310426886.5

(51) Int. Cl.

| | |
|---|---|
| ***H10H 20/853*** | (2025.01) |
| ***H10W 90/00*** | (2026.01) |
| *H10H 20/01* | (2025.01) |
| *H10H 20/854* | (2025.01) |

(52) U.S. Cl.

CPC .......... *H10H 20/853* (2025.01); *H10W 90/00* (2026.01); *H10H 20/0362* (2025.01); *H10H 20/854* (2025.01)

(58) Field of Classification Search

CPC ............. H10H 20/0362; H10H 20/853; H10H 20/854; H10H 20/832; H10H 29/142; H10H 20/857; H10H 20/851; H10H 20/855; H10W 90/00; H10W 70/09; H10D 86/60; H10K 59/877; H10K 59/8792; H10K 50/865; G02F 1/133351

See application file for complete search history.

(56) References Cited

U.S. PATENT DOCUMENTS

| | | | | |
|---|---|---|---|---|
| 2012/0038047 A1* | 2/2012 | Do | ........................ | H10W 70/09 438/126 |
| 2018/0233536 A1* | 8/2018 | Chang | .................. | H10H 20/857 |
| 2020/0091376 A1* | 3/2020 | Lim | ..................... | H10H 20/832 |
| 2020/0185453 A1* | 6/2020 | Cho | ..................... | H10H 29/142 |

(Continued)

FOREIGN PATENT DOCUMENTS

WO WO-2022233046 A1 * 11/2022 ........... H10H 20/851

*Primary Examiner* — Richard J Hong

(57) ABSTRACT

A display panel and a manufacturing method thereof, and a splicing display screen are provided. The display panel includes a substrate, light-emitting components, a frame, and an encapsulant. The light-emitting components are disposed on the substrate. The frame is disposed on the substrate and located at a periphery around the light-emitting components. The encapsulant is disposed to cover outer surfaces of the light-emitting components. The frame includes a first barrier wall and a second barrier wall sequentially stacked in a direction from the substrate to the light-emitting components, and a transmittance of the second barrier wall is greater than a transmittance of the first barrier wall.

18 Claims, 7 Drawing Sheets

(56) References Cited

U.S. PATENT DOCUMENTS

| | | | | |
|---|---|---|---|---|
| 2022/0068978 | A1* | 3/2022 | Gong | H10D 86/60 |
| 2022/0085306 | A1* | 3/2022 | Peng | G02F 1/133351 |
| 2022/0208949 | A1* | 6/2022 | Kang | H10K 50/865 |
| 2023/0209962 | A1* | 6/2023 | Seong | H10K 59/877<br>257/40 |
| 2024/0063351 | A1* | 2/2024 | Zhao | H10H 20/854 |
| 2024/0306479 | A1* | 9/2024 | Wu | H10K 59/8792 |
| 2025/0048811 | A1* | 2/2025 | Li | H10H 20/855 |

* cited by examiner providing a light-emitting substrate and an encapsulating film material; wherein the light-emitting substrate comprises the substrate and the light-emitting components disposed on the substrate; the encapsulating film material comprises a base material, the frame disposed on the base material, and the encapsulant disposed on the base material; the encapsulant is disposed at an inside of the frame and connected to an inner surface of the frame — S210

↓ attaching the encapsulating film material to the light-emitting substrate to position the frame at the periphery around the light-emitting components and place the first barrier wall between the second barrier wall and the substrate; and encapsulating the light-emitting components to obtain the display panel by allowing the encapsulant to deform upon contact with the light-emitting components — S220

FIG. 12

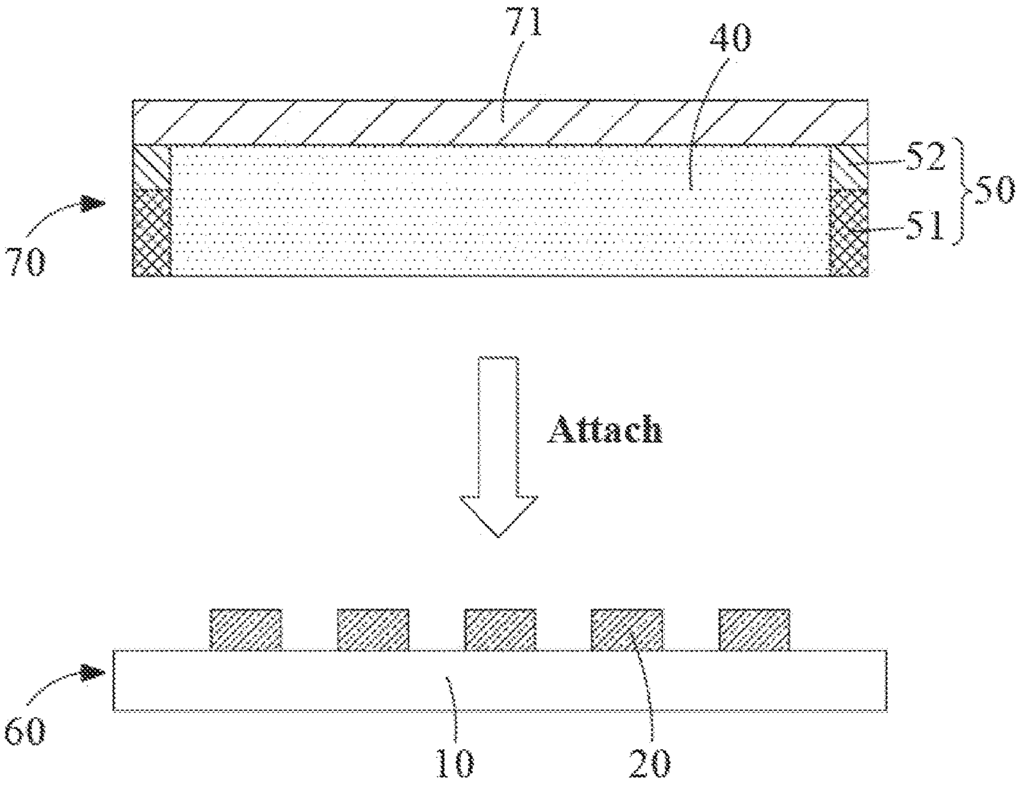

FIG. 13

DISPLAY PANEL HAVING TWO STACKED BARRIER WALLS AND MANUFACTURING METHOD THEREOF AND SPLICING DISPLAY SCREEN

CROSS-REFERENCE TO RELATED APPLICATION

This application claims the benefit of priority of China Patent Application No. 202310426886.5, filed on Apr. 20, 2023, the contents of which are incorporated by reference as if fully set forth herein in their entirety.

TECHNICAL FIELD

The present disclosure relates to a field of display technologies, and in particular, to a display panel and a manufacturing method thereof and a splicing display screen.

DESCRIPTION OF RELATED ART

Light-emitting diode (LED) panel (such as MICRO LED panel, or Mini LED panel) has good stability, a long service life, a low operating temperature, low power consumption, a high color saturation, a fast response, a strong contrast ratio and other advantages, and has great application prospects.

With the development of display application technology, the splicing display technology has attracted much attention. A LED splicing display screen is formed by multiple display panels. At present, the LED splicing display screen is widely used in conference centers, security monitoring, home large-screen TV and other application scenarios.

However, at present, there is a problem of light leakage at a splicing part of display panels in a LED splicing display screen, which can lead to problems of blue, yellow, bright lines at the splicing part of the display panels, thereby resulting in poor display performance of the LED splicing display screen.

SUMMARY OF THE INVENTION

An embodiment of the present disclosure provides a display panel and a manufacturing method thereof, and a splicing display screen. The present disclosure can avoid the problem of light leakage at splicing seams of the display panels of the splicing display screen, thereby eliminating blue, yellow, and bright lines displayed at the splicing seams of the display panels. At the same time, the present disclosure can avoid the phenomenon of black frame appearing at the splicing seams of the display panels of the splicing display screen, thereby improving the display effect of the splicing display screen.

In a first aspect, the embodiment of the present disclosure provides a display panel, and the display panel includes:

a substrate;

light-emitting components, disposed on the substrate;

a frame, disposed on the substrate and located at a periphery around the light-emitting components; and an encapsulant, disposed to cover outer surfaces of the light-emitting components.

Specifically, the frame includes a first barrier wall and a second barrier wall sequentially stacked in a direction from the substrate to the light-emitting components, and a transmittance of the second barrier wall is greater than a transmittance of the first barrier wall.

A height of the first barrier wall is greater than a height of each of the light-emitting components.

In some embodiments, a height of the first barrier wall is greater than a height of the second barrier wall.

In some embodiments, the transmittance of the second barrier wall is less than or equal to a transmittance of the encapsulant.

In some embodiments, the encapsulant is filled in a storage space enclosed by the substrate and the frame.

In some embodiments, the encapsulant includes at least one from a group consisting of epoxy resin, silicone rubber resin, epoxy modified silicone rubber resin, silicone rubber modified epoxy resin, polyurethane, and polyvinyl acetate.

In some embodiments, the display panel further includes a base material. The base material is disposed at a side of the frame and a side of the encapsulant facing away from the substrate; and the frame and the encapsulant are connected to the base material.

In a second aspect, an embodiment of the present disclosure provides a manufacturing method of the display panel, the manufacturing method is used to manufacture the display panel mentioned above, and the manufacturing method includes:

providing a light-emitting substrate and the frame, wherein the light-emitting substrate includes the substrate and the light-emitting components disposed on the substrate;

attaching the frame to the light-emitting substrate to position the frame at the periphery around the light-emitting components and place the first barrier wall between the second barrier wall and the substrate; and applying the encapsulant to the outer surfaces of the light-emitting components to obtain the display panel.

In a third aspect, an embodiment of the present disclosure provides a manufacturing method of the display panel mentioned above, and the manufacturing method includes:

providing a light-emitting substrate and an encapsulating film material; the light-emitting substrate includes the substrate and the light-emitting components disposed on the substrate; the encapsulating film material includes a base material, the frame disposed on the base material, and the encapsulant disposed on the base material; the encapsulant is disposed at an inside of the frame and connected to an inner surface of the frame; and attaching the encapsulating film material to the light-emitting substrate to position the frame at the periphery around the light-emitting components and place the first barrier wall between the second barrier wall and the substrate, and encapsulating the light-emitting components to obtain the display panel by allowing the encapsulant to deform upon contact with the light-emitting components.

In a fourth aspect, an embodiment of the present disclosure provides a splicing display screen, and the splicing display screen includes at least two display panels, and each of the at least two display panels is the display panel mentioned above.

By setting the frame at the periphery around the light-emitting components, the display panel provided in the embodiment of the present disclosure can block a part of the light of the light-emitting components emitted towards sides of the display panel, thereby avoiding the problem of light leakage at the periphery around the display panel, avoiding the problem of light leakage at splicing seams of display panels of the splicing display screen, eliminating the blue, yellow, and bright lines that appear at splicing parts of the display panels, and improving the display effect of the splicing display screen. In addition, it can be understood that when the transmittance of the frame is low or zero, the frame appears black, which can cause the phenomenon of black frame at the splicing seams of the display panels, thereby resulting in a poor display effect of the splicing display screen. The frame of the present disclosure includes the first barrier wall and the second barrier wall. Specifically, the transmittance of the second barrier wall is greater than the transmittance of the first barrier wall. When an audience watches the splicing display screen, the audience first sees the second barrier wall, so that the transmittance of the second barrier wall is set to be relatively high, and the upper surface of the frame can be prevented from being black, so that the phenomenon that a black frame appears at splicing seams of the display panels of the splicing display screen can be avoided, and the display effect of the splicing display screen can be improved.

BRIEF DESCRIPTION OF THE DRAWINGS

In order to more clearly illustrate the technical solutions in embodiments of the present disclosure, the following will briefly introduce the drawings used in the description of the embodiments.

FIG. 12 is a second flowchart of a manufacturing method of a display panel provided in an embodiment of the present disclosure.

FIG. 13 is a schematic diagram of attaching an encapsulating film material to a light-emitting substrate provided in an embodiment of the present disclosure.

DETAILED DESCRIPTION OF SPECIFIC EMBODIMENTS OF THE INVENTION

The following will provide a clear and complete description of the technical solution in embodiments of the present disclosure in conjunction with drawings in the embodiments. Apparently, the described embodiments are only a part of the embodiments of the present disclosure, not all of them. Based on the embodiments in the present disclosure, all other embodiments obtained by those skilled in the art without creative work should fall within the scope of protection of the present disclosure.

Figure 1:
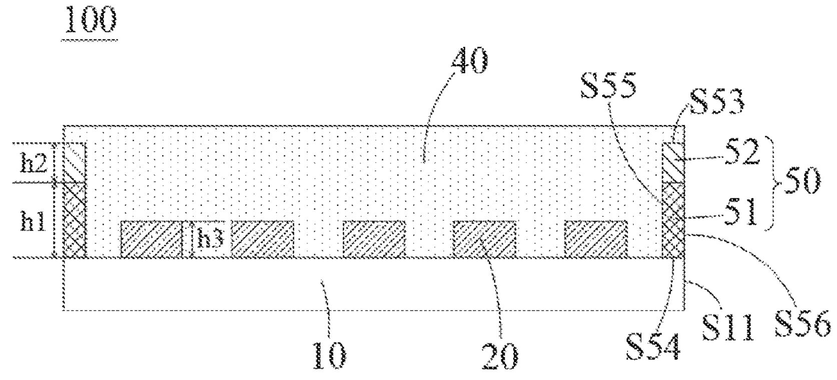
FIG. 1 is a first structural schematic diagram of a display panel provided in an embodiment of the present disclosure.
Figure 2:
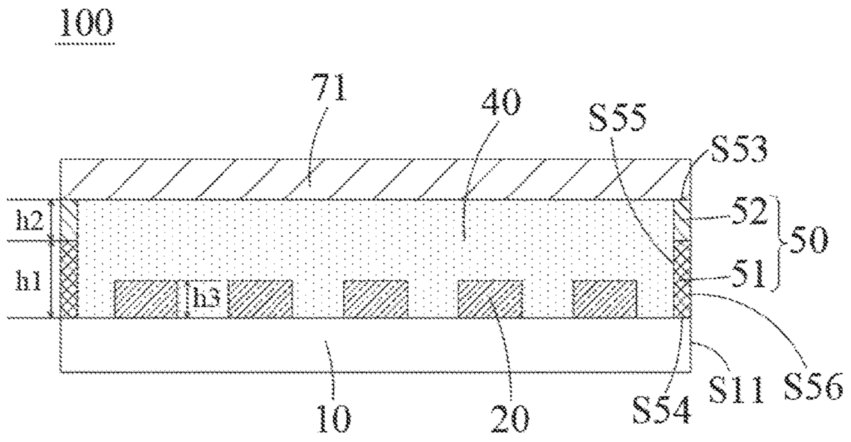
FIG. 2 is a second structural schematic diagram of a display panel provided in an embodiment of the present disclosure.
Figure 3:
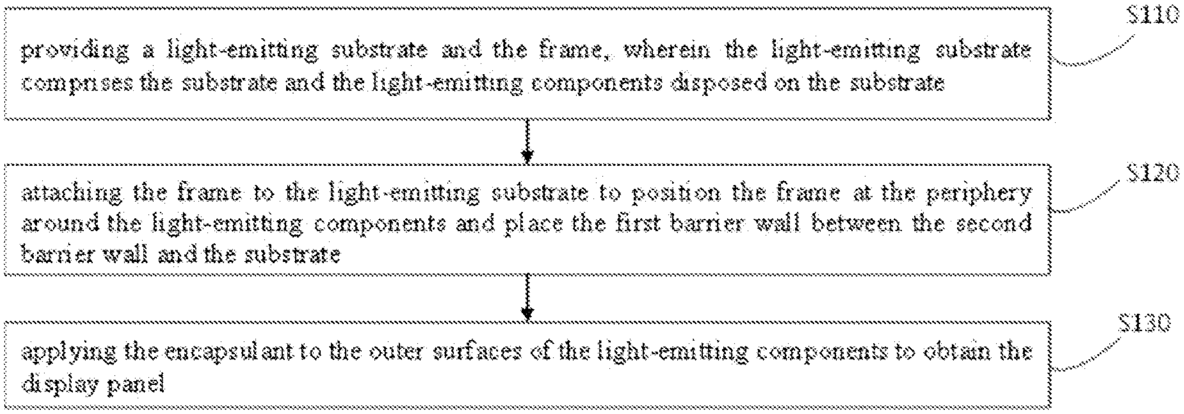
FIG. 3 is a first flowchart of a manufacturing method of a display panel provided in an embodiment of the present disclosure.
Figure 4:
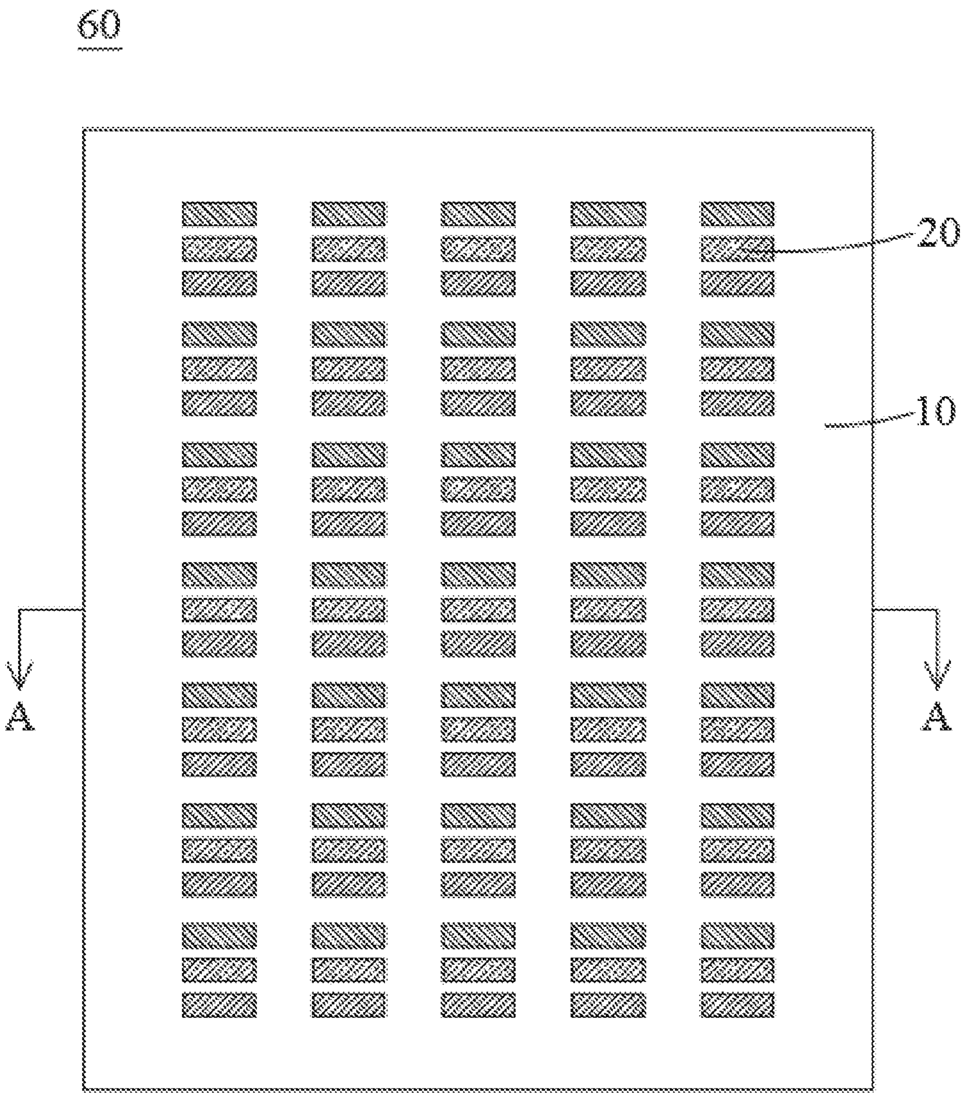
FIG. 4 is a top schematic view of a light-emitting substrate provided in an embodiment of the present disclosure.
Figure 5:
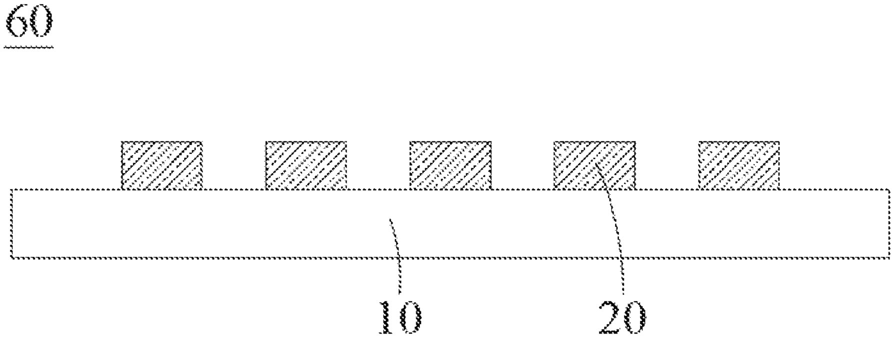
FIG. 5 is a sectional schematic view of a light-emitting substrate provided in an embodiment of the present disclosure.

Referring to FIG. 1 and FIG. 2, a display panel 100 is provided in an embodiment of the present disclosure. The display pane 100 includes a substrate 10, light-emitting components 20, a frame 50, and an encapsulant 40. The light-emitting components are disposed on the substrate 10. The frame 50 is disposed on the substrate 10 and located at a periphery around the light-emitting components 20. The encapsulant 40 is configured to cover outer surfaces of the light-emitting components 20. Furthermore, the frame 50 includes a first barrier wall 51 and a second barrier wall 52 sequentially stacked in a direction from the substrate 10 to the light-emitting components 20, and a transmittance of the second barrier wall 52 is greater than a transmittance of the first barrier wall 51.

Exemplarily, each of the light-emitting components 20 can be an LED, such as a MICRO LED or a Mini LED.

Exemplarily, the light-emitting components 20 on the substrate 10 include a light-emitting component 20 that emits red light, a light-emitting component 20 that emits green light, and a light-emitting component 20 that emits blue light to form a colorful display picture.

It should be noted that in the embodiments of the present disclosure, transmittance refers to the transmittance of visible light (390 nm to 780 nm).

Exemplarily, the transmittance of the first barrier wall 51 can be 0-20%, such as 0, 0.5%, 1%, 3%, 5%, 8%, 10%, 12%, 15%, 17%, or 20%. Exemplarily, the color of the first barrier wall 51 can be black or dark to provide a better shading effect.

Exemplarily, the transmittance of the second barrier wall 52 can be 20%-60%, such as 20%, 21%, 23%, 25%, 28%, 30%, 32%, 35%, 38%, 40%, 42%, 45%, 48%, 50%, 52%, 55%, 58%, or 60%. Exemplarily, the color of the second barrier wall 52 can be a light color (such as gray), so that the color of the second barrier wall 52 can be similar to the color of the encapsulant 40, thereby avoiding the phenomenon of black frame at a position of the frame 50 of the display panel 100.

Exemplarily, the transmittance of the second barrier wall 52 can be less than or equal to the transmittance of the encapsulant 40. It can be understood that the encapsulant 40 is located above the light-emitting components 20, so that the encapsulant 40 needs to maintain a relatively high transmittance to allow the light of the light-emitting components 20 to pass through, thereby displaying a picture. However, as a part of the frame, the second barrier wall 52 is mainly configured for shading rather than transmitting light. Therefore, the second barrier wall 52 needs to maintain a relatively low transmittance to achieve the shading effect.

Exemplarily, the transmittance of the encapsulant 40 can be 70%-100%, such as 70%, 75%, 80%, 85%, 90%, 95%, or 100%. This means that the color of the encapsulant 40 can be transparent or semi-transparent.

Exemplarily, materials of the first barrier wall 51 can be a resin material and a pigment, and the color of the pigment can be black or dark, so that the first barrier wall 51 appears black or dark for the shading effect. Exemplarily, the resin material can include at least one from a group consisting of epoxy resin and silicone rubber, and the pigment can include at least one of carbon powder and iron oxide.

Exemplarily, materials of the second barrier wall 52 can be a resin material and a pigment. The pigment with a lighter color can be selected or the additive amount of the pigment is reduced, so that the second barrier wall 52 has a lighter color (such as gray), so that the color of the second barrier wall 52 is similar to the color of the encapsulant 40 to avoid the phenomenon of black frame caused by the frame 50 at edges of the display panel 100. Exemplarily, the resin material can include at least one from a group consisting of epoxy resin and silicone rubber, and the pigment can include at least one of carbon powder and iron oxide.

Exemplarily, the encapsulant 40 can include at least one from a group consisting of epoxy resin, silicone rubber resin, epoxy modified silicone rubber resin, silicone rubber modified epoxy resin, polyurethane, and polyvinyl acetate.

Referring to FIG. 2, the display panel 100 further includes a base material 71. The base material 71 is disposed at a side of the frame 50 facing away from the substrate 10 and a side of the encapsulant 40 facing away from the substrate 10. The frame 50 and the encapsulant 50 are connected to the base material 71. Exemplarily, a material of the base material 71 can be polyethylene terephthalate (PET).

By setting the frame 50 at the periphery around the light-emitting components 20, the display panel 100 provided in the embodiment of the present disclosure can block a part of the light of the light-emitting components 20 emitted towards sides of the display panel 100, thereby avoiding the problem of light leakage at the periphery around the display panel 100, avoiding the problem of light leakage at splicing seams of display panels 100 of the splicing display screen, eliminating the blue, yellow, and bright lines that appear at splicing parts of the display panels 100, and improving the display effect of the splicing display screen. In addition, it can be understood that when the transmittance of the frame 50 is low or zero, the frame 50 appears black, which can cause the phenomenon of black frame at the splicing seams of the display panels 100, thereby resulting in a poor display effect of the splicing display screen. The frame 50 of the present disclosure includes the first barrier wall 51 and the second barrier wall 52. Specifically, the transmittance of the second barrier wall 52 is greater than the transmittance of the first barrier wall 51. When an audience watches the splicing display screen, the audience first sees the second barrier wall 52, so that the transmittance of the second barrier wall 52 is set to be relatively high, and the upper surface S53 of the frame 50 can be prevented from being black, so that the phenomenon that a black frame appears at splicing seams of the display panels 100 of the splicing display screen can be avoided, and the display effect of the splicing display screen can be improved.

Referring to FIG. 1, a height h1 of the first barrier wall 51 is greater than a height h3 of each of the light-emitting components 20. It can be understood that due to the low transmittance of the first barrier wall 51, which means that the first barrier wall 51 has a strong ability to block light. By setting the height h1 of the first barrier wall 51 to be greater than the height h3 of each of the light-emitting components 20, the part of the light emitted by the light emitting components 20 towards the sides can be sufficiently blocked, thereby avoiding the problem of light leakage at the periphery around the display panel 100 and avoiding the problem of light leakage at the splicing seams of the display panels 100 on the splicing display screen.

Referring to FIG. 1, the height h1 of the first barrier wall 51 is greater than a height h2 of the second barrier wall 52. It can be understood that due to the low transmittance of the first barrier wall 51 and the high transmittance of the second barrier wall 52, the first barrier wall 51 has a stronger ability to block light, while the second barrier wall 52 has a weaker ability to block light. Therefore, by setting the height h1 of the first barrier wall 51 to be greater than the height h2 of the second barrier wall 52, in other word, by setting the first barrier wall 51 to occupy a large portion of the frame 50, the frame 50 can maintain a low transmittance in the whole and achieve the shading effect. In addition, by setting the height second barrier wall 52 having a lower height, the overall height of the frame 50 can be maintained at a low height, which is conducive to achieving a lower weight and a thinner size of the display 25 panel 100, thereby achieving a lower weight and a thinner size of the splicing display screen.

Referring to FIG. 1, the frame 50 includes an upper surface S53 and a lower surface S54 opposite to the upper surface S53, and the frame further includes an inner surface S55 and an outer surface S56 opposite to the inner surface S55. The frame 50 is connected to the substrate 10 through the lower surface S54. The inner surface S55 of the frame 50 is disposed towards the light-emitting components 20, and the outer surface S56 of the frame 50 is aligned with a side surface S11 of the substrate 10. It can be understood that when multiple display panels 100 are spliced to prepare a spliced display screen, it is necessary to connect the side surfaces S11 of the substrates 10 of adjacent two display panels 100 together; meanwhile, if there is a distance between an outer edge (i.e., the outer surface S56) of the frame 50 and an edge (i.e., the side surface S11) of the substrate 10, meanwhile, a width of a non-display area at a splicing seam between the adjacent display panels 100 is a sum of widths of two frames 50 and an edge area of two substrate 10 (the edge area refers to the area between the outer edge of frame 50 and the edge of substrate 10), that is to say, the width of the non-display area at the splicing seam between the adjacent display panels 100 are relatively large, which will affect the display effect of the splicing display screen. In the present disclosure, by setting the outer surface S56 of the frame 50 to be aligned with the side surface S11 of the substrate 10, the width of the non-display area at the splicing seam between the adjacent display panels 100 is reduced and equal to the widths of two frames 50. Since the width of the non-display area at the splicing seam between the adjacent display panels 100 is reduced, the display effect of the splicing display screen is improved.

Referring to FIG. 1, the encapsulant 40 is configured to filled in a storage space enclosed by the substrate 10 and the frame 50. It can be seen that when the encapsulant 40 is filled in the storage space enclosed by the substrate 10 and the frame 50, the encapsulant 40 is tightly connected to the inner surface S55 of the frame 50, and the encapsulant 40 is tightly wrapped the outer surfaces of the light-emitting components 20. At the same time, the encapsulant 40 also connects to positions other than the light-emitting device 20 in the area enclosed by the frame 50 on the substrate 10. Therefore, the stability of the connection between the encapsulant 40 and the frame 50 can be improved, as well as the stability of the connection between the encapsulant 40 and the light-emitting components 2, thereby preventing the encapsulant 40 from falling off the display panel 100.

Referring to FIG. 1, the encapsulant 40 can cover the upper surface S53 of the frame 50. At this time, the encapsulant 40 is connected to the upper surface S53 of the frame 50, thereby further increasing the stability of the connection between the encapsulant 40 and the frame 50.

Referring to FIG. 3 and FIG. 4 to FIG. 11, an embodiment of the present disclosure provides a manufacturing method of the display panel 100 in any one of the above embodiments. The manufacturing method of the display panel can include following steps:

Step S110, referring to FIG. 4 to FIG. 7, a light-emitting substrate 60 and a frame 50 are provided. The light-emitting substrate 60 includes a substrate 10 and a light-emitting components 20 disposed on the substrate 10. The frame 50 includes the first barrier wall 51 and the second barrier wall 52 stacked sequentially, and the transmittance of the second barrier wall 52 is greater than the transmittance of the first barrier wall 51.

Figure 6:
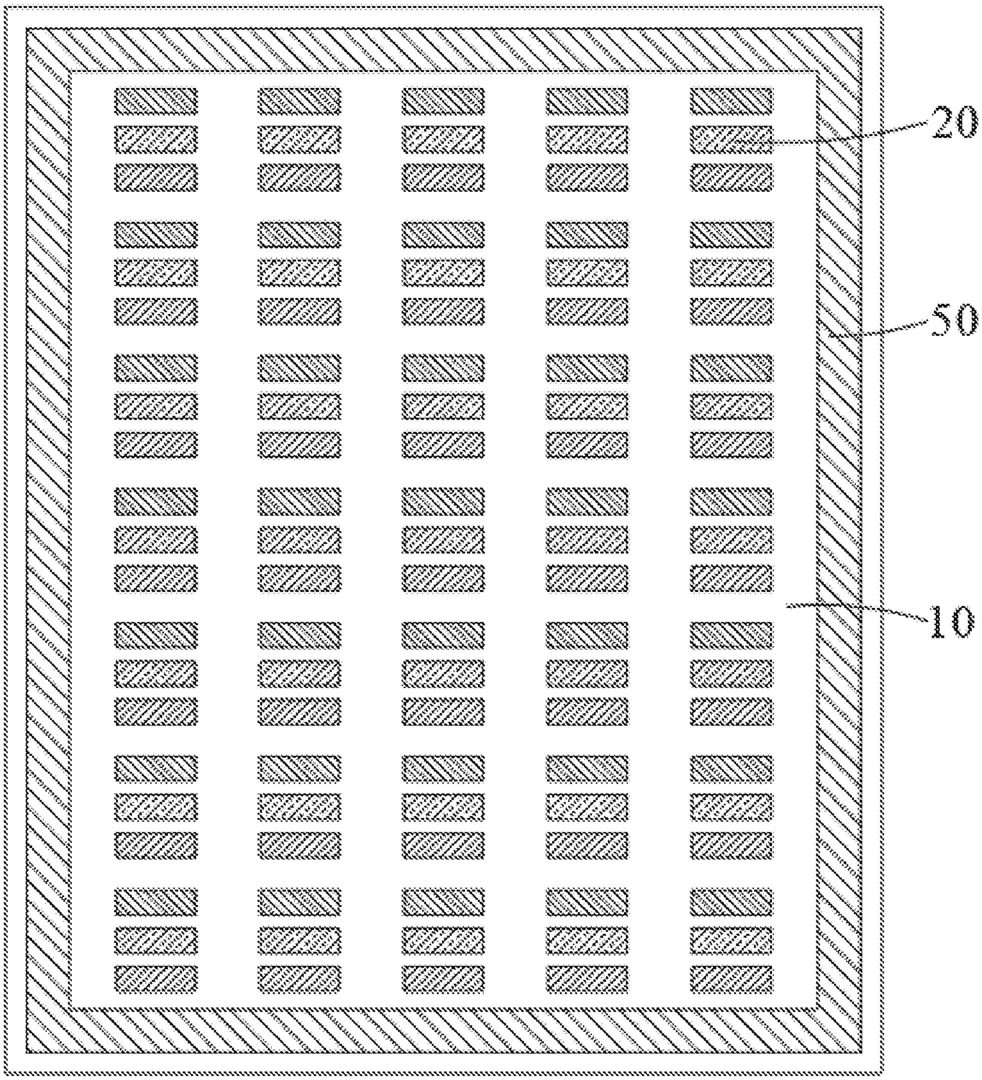
FIG. 6 is a first schematic diagram of a frame being attached to a light-emitting substrate provided in an embodiment of the present disclosure.
Figure 7:
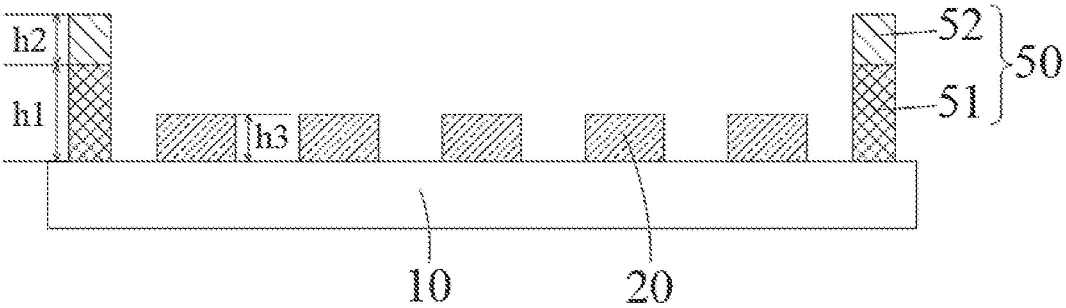
FIG. 7 is a second schematic diagram of a frame being attached to a light-emitting substrate provided in an embodiment of the present disclosure.

Step 120, referring to FIG. 6 and FIG. 7, the frame 50 is attached to the light-emitting substrate 60 to locate the frame 50 at the periphery around the light-emitting components 20 and locate the first barrier wall 51 between the second barrier wall 52 and the substrate 10.

Exemplarily, the "the frame 50 is attached to the light-emitting substrate 60" may include: using an adhesive to bond the frame 50 and the light-emitting substrate 60.

Step 130, referring to FIG. 1 and FIG. 8 to FIG. 11, the encapsulant 40 is applied to the outer surfaces of the light-emitting components 20 to obtain the display panel 100.

Exemplarily, the "the encapsulant 40 is applied to the outer surfaces of the light-emitting components 20" may include: providing an encapsulated material with fluidity, applying the encapsulated material to the storage space enclosed by the substrate 10 and the frame 50, and solidifying the encapsulated material to form the encapsulant 40. In an embodiment, the encapsulated material may include at least one from a group consisting of epoxy resin, silicone rubber resin, epoxy modified silicone rubber resin, silicone rubber modified epoxy resin, polyurethane, and polyvinyl acetate.

Figure 8:
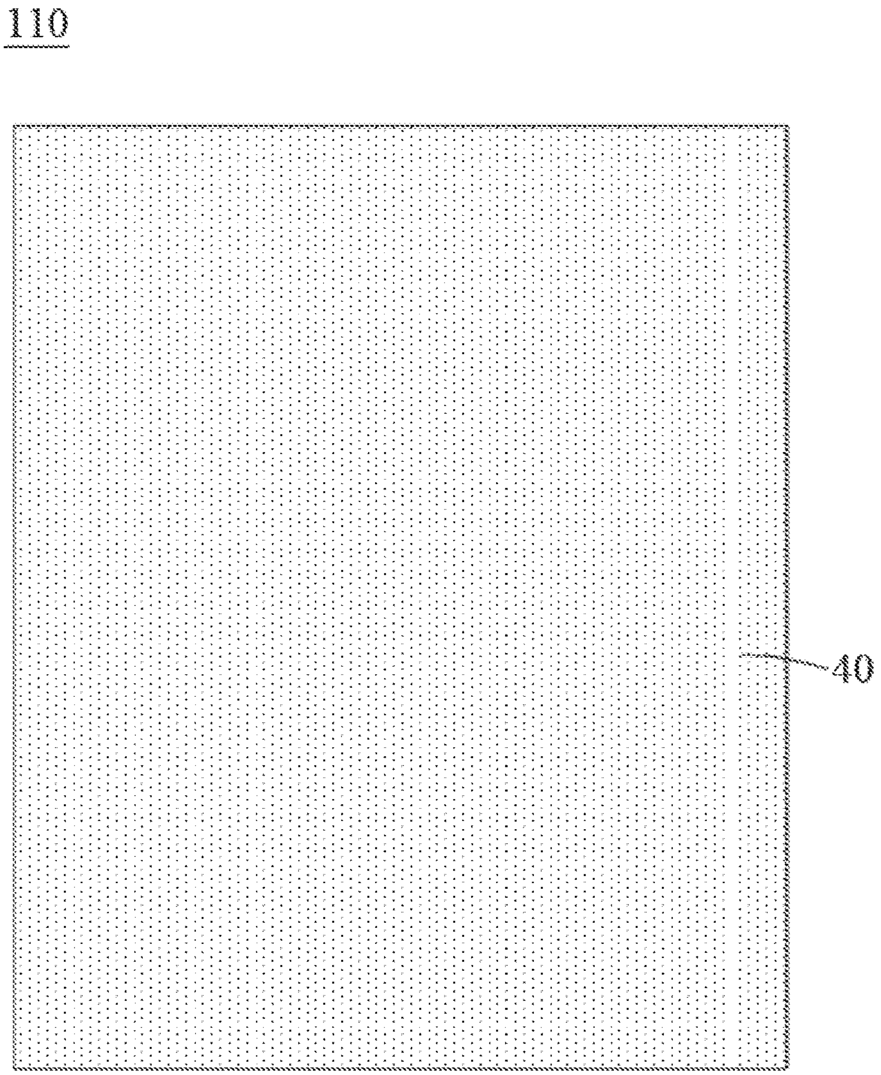
FIG. 8 is a first schematic diagram of an encapsulant being applied to outer surfaces of light-emitting components provided in an embodiment of the present disclosure.
Figure 9:
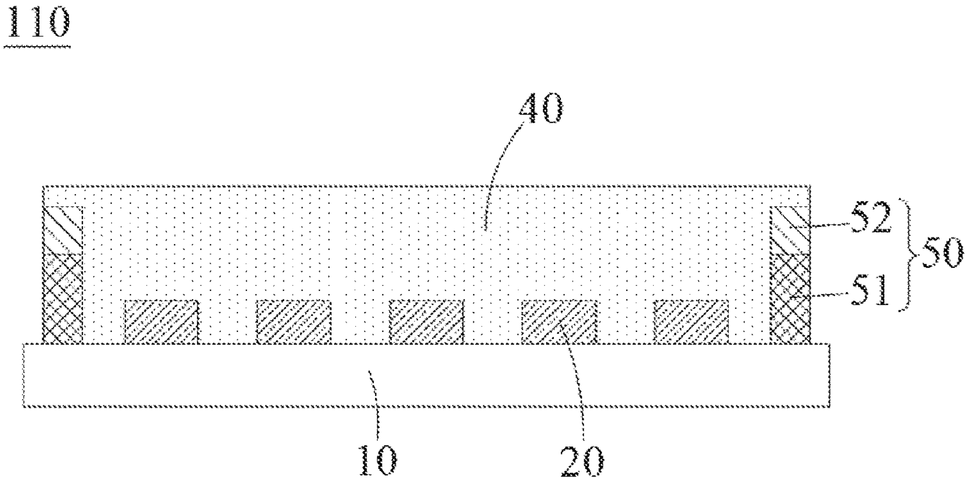
FIG. 9 is a second schematic diagram of an encapsulant being applied to outer surfaces of light-emitting components provided in an embodiment of the present disclosure.
Figure 10:
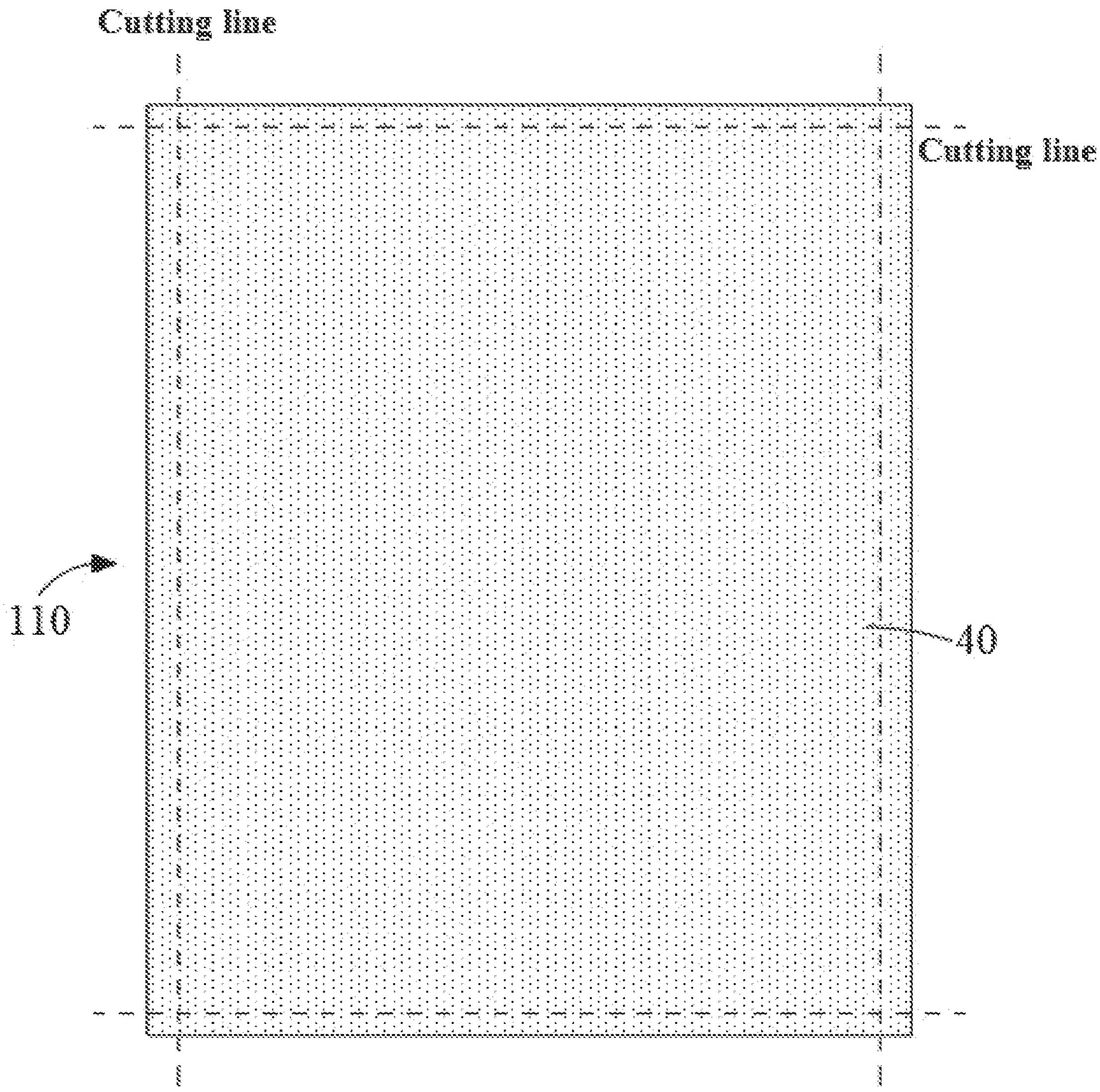
FIG. 10 is a first schematic diagram of cutting a first composite substrate provided in an embodiment of the present disclosure.
Figure 11:
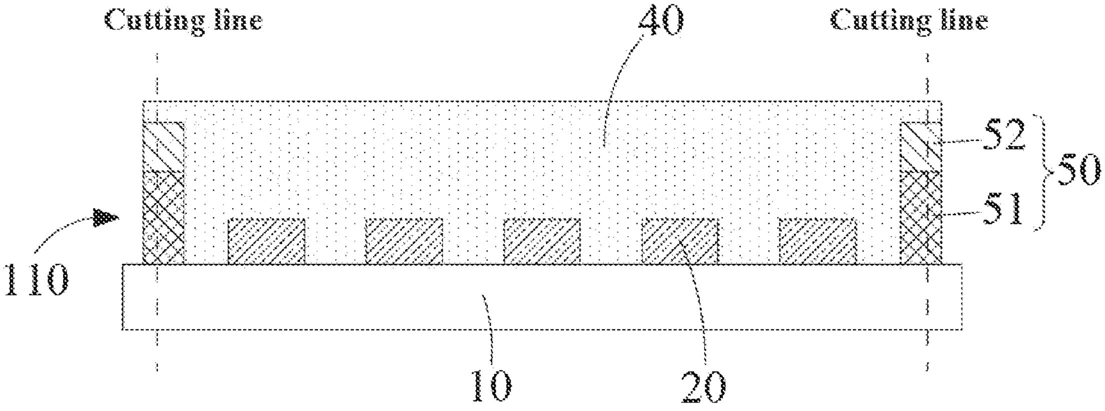
FIG. 11 is a second schematic diagram of cutting a first composite substrate provided in an embodiment of the present disclosure.

Exemplarily, the "the encapsulant 40 is applied to the outer surfaces of the light-emitting components 20 to obtain the display panel 100" may include:

- referring to FIG. 8 and FIG. 9, applying the encapsulant 40 to the outer surfaces of the light-emitting components 20 to obtain a first composite substrate 110; and
- referring to FIG. 1, FIG. 10, and FIG. 11, cutting the edge area of the first composite substrate 110 to make the outer surface S56 of frame 50 be aligned with the side surface S11 of the substrate 10.

Referring to FIG. 2 and FIG. 12 to FIG. 14, an embodiment of the present disclosure further provides a manufacturing method of the display panel 100 in any one of the above embodiments. The manufacturing method of the display panel includes following steps.

Step S210, referring to FIG. 13, a light-emitting substrate 60 and an encapsulating film material 70 are provided. The light-emitting substrate 60 includes the substrate and the light-emitting components 20 disposed on the substrate 10. The encapsulating film material 70 includes a base material 71, the frame 50 disposed on the base material 71, and the encapsulant 40 disposed on the base material 71. The encapsulant 40 is disposed at an inside of the frame 50 and connected to an inner surface S55 of the frame 50. The frame 50 includes the first barrier wall 51 and the second barrier wall 52 stacked sequentially, and the transmittance of the second barrier wall 52 is greater than the transmittance of the first barrier wall 51.

It should be noted that the encapsulant 40 of the encapsulating film material 70 is flexible before being attached to the light-emitting substrate 60, that is, the encapsulant 40 can be deformed when an external force acts on the encapsulant 40.

Exemplarily, before the encapsulating film material 70 is attached to the light-emitting substrate 60, the encapsulant 40 of the encapsulating film material 70 can be a pressure sensitive adhesive or a semi-cured adhesive. The semi-cured adhesive can include at least one from a group consisting of epoxy resin, silicone rubber resin, epoxy modified silicone rubber resin, silicone rubber modified epoxy resin, polyurethane, and polyvinyl acetate.

Exemplarily, a material of the base material 71 can be PET.

Figure 14:
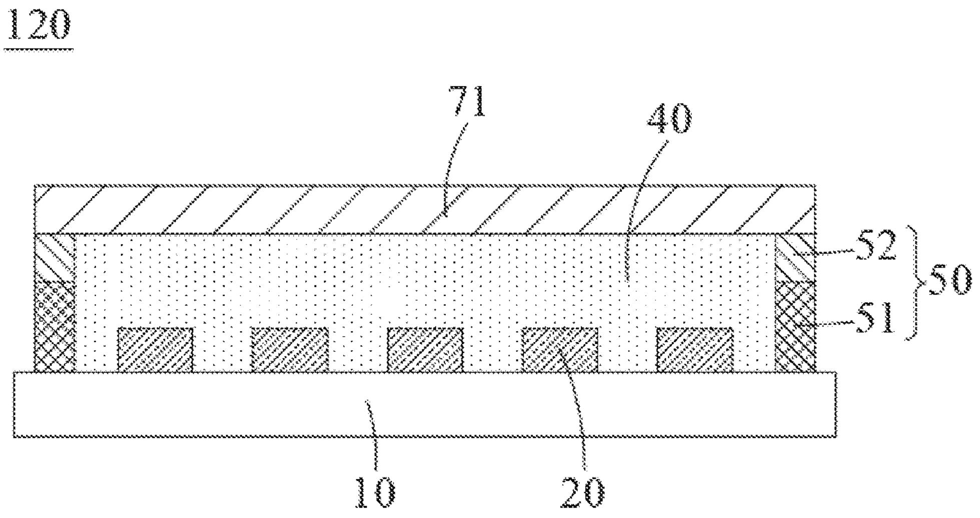
FIG. 14 is structural schematic diagram of a second composite substrate provided in an embodiment of the present disclosure.

Step S220, referring to FIG. 2, FIG. 13, and FIG. 14, the encapsulating film material 70 is attached to the light-emitting substrate 60 to locate the frame 50 at the periphery around the light-emitting components 20 and locate the first barrier wall 51 between the second barrier wall 52 and the substrate 10. The encapsulant 40 contacts the light-emitting components 20 to make the encapsulant 40 undergo deformation to wrap the light-emitting components 20, thereby obtaining the display panel 100.

Exemplarily, when the encapsulant 40 of the encapsulating film material 70 is a pressure sensitive adhesive, after the encapsulating film material 70 is attached to the light-emitting substrate 60, pressure can be applied to the encapsulating film material 70 to cause deformation after the encapsulant 40 contacts the light-emitting components 20, thereby encapsulating the light-emitting components 20. Under the pressure, the bonding force of the encapsulant 40 is enhanced, which makes the connection among the encapsulant 40, the light-emitting components 20, and the substrate 10 firmer.

Exemplarily, when the encapsulant 40 of the encapsulating film material 70 is a semi-cured adhesive, after the encapsulating film material 70 is attached to the light-emitting substrate 60, pressure can be applied to the encapsulating film material 70 to cause deformation after the encapsulant 40 contacts the light-emitting components 20, thereby encapsulating the light-emitting components 20. Afterwards, the encapsulating film material 70 can be heated to fully solidify the encapsulant 40 of the encapsulating film material 70.

It can be understood that the encapsulant 40 has adhesiveness, so that the encapsulant 40 can be configured to connect with the light-emitting components 20 and the substrate 10 by using its own adhesiveness.

Exemplarily, the first barrier wall 51 can be a material with adhesiveness, so that the first barrier wall 51 can be configured to bond with the substrate 10, or an optical adhesive can be set between the first barrier wall 51 and the substrate 10 to achieve the connection between the first barrier wall 51 and the substrate 10.

Exemplarily, the "the encapsulating film material 70 is attached to the light-emitting substrate 60 to locate the frame 50 at the periphery around the light-emitting components 20 and locate the first barrier wall 51 between the second barrier wall 52 and the substrate 10. The encapsulant 40 contacts the light-emitting components 20 to make the encapsulant 40 undergo deformation to wrap the light-emitting components 20, thereby obtaining the display panel 100" can include:

referring to FIG. 13 and FIG. 14, attaching a side of the encapsulating film material 70 provided with the encapsulant 40 to the light-emitting substrate 60 to obtain a second composite substrate 120;

referring to FIG. 2 and FIG. 14, cutting an edge area of the second composite substrate 120 to make the outer surface S56 of the frame 50 be flush with the side surface S11 of the substrate 10.

Figure 15:
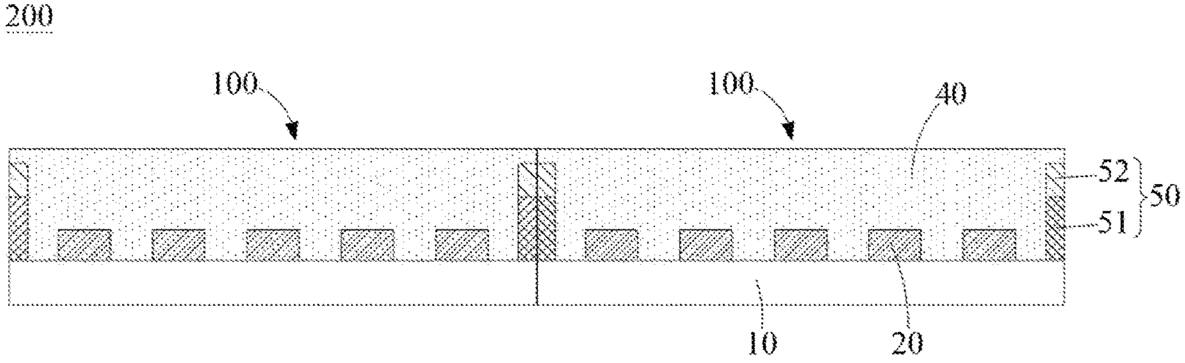
FIG. 15 is a first structural schematic diagram of a splicing display screen provided in an embodiment of the present disclosure.
Figure 16:
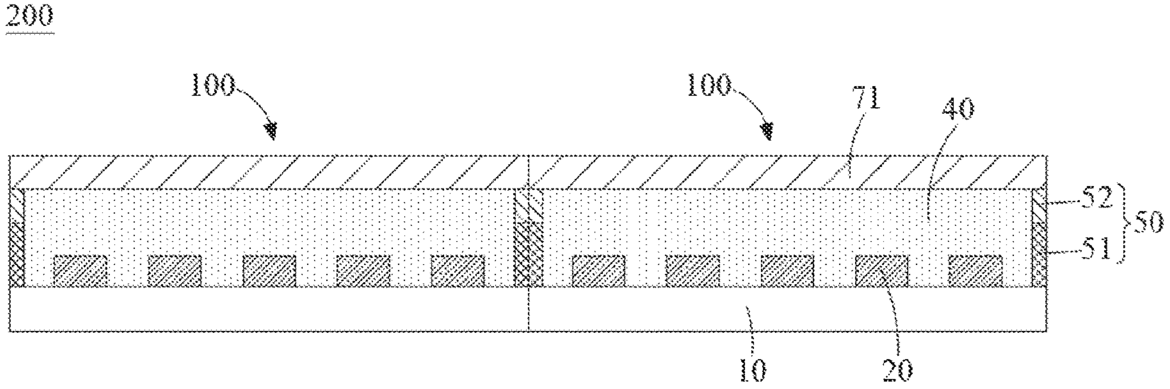
FIG. 16 is a second structural schematic diagram of a splicing display screen provided in an embodiment of the present disclosure.

Referring to FIG. 15 and FIG. 16, an embodiment of the disclosure provides a splicing display screen, the splicing display screen includes at least two display panels 100 spliced together, and each of the at least two display panels 100 is the display panel in any one of the above embodiments.

The display panel and the manufacturing method thereof and the splicing display screen provided by the embodiments of the present disclosure are described in detail above, and specific embodiments are used herein to illustrate the principles and embodiments of the present disclosure. The description of the above embodiments is only used to help understand the method and the core idea of the present disclosure. Meanwhile, for those skilled in the art, according to the concept of the present invention, there are changes in the specific embodiment and the application scope, and in summary, the content of the specification should not be interpreted as a limitation of the present disclosure.

What is claimed is:

1. A display panel, comprising:

a substrate;

light-emitting components, disposed on the substrate;

a frame, disposed on the substrate and located at a periphery around the light-emitting components; and an encapsulant, disposed to cover outer surfaces of the light-emitting components;

wherein the frame comprises a first barrier wall and a second barrier wall sequentially stacked in a direction from the substrate to the light-emitting components, and a transmittance of the second barrier wall is greater than a transmittance of the first barrier wall, and wherein the transmittance of the second barrier wall is less than or equal to a transmittance of the encapsulant.

2. The display panel according to claim 1, wherein a height of the first barrier wall is greater than a height of each of the light-emitting components.

3. The display panel according to claim 1, wherein a height of the first barrier wall is greater than a height of the second barrier wall.

4. The display panel according to claim 1, wherein the frame comprises an upper surface and a lower surface opposite to the upper surface, and the frame further comprises an inner surface and an outer surface opposite to the inner surface; and the frame is connected to the substrate through the lower surface, the inner surface of the frame is disposed towards the light-emitting components, and the outer surface of the frame is flush with a side surface of the substrate.

5. The display panel according to claim 1, wherein the encapsulant comprises at least one selected from a group consisting of epoxy resin, silicone rubber resin, epoxy modified silicone rubber resin, silicone rubber modified epoxy resin, polyurethane, and polyvinyl acetate.

6. The display panel according to claim 1, further comprising a base material, wherein the base material is disposed at a side of the frame and a side of the encapsulant facing away from the substrate; and the frame and the encapsulant are connected to the base material.

7. A manufacturing method of the display panel of claim 1, wherein the manufacturing method comprises:

providing a light-emitting substrate and the frame, wherein the light-emitting substrate comprises the substrate and the light-emitting components disposed on the substrate;

attaching the frame to the light-emitting substrate to position the frame at the periphery around the light-emitting components and place the first barrier wall between the second barrier wall and the substrate; and applying the encapsulant to the outer surfaces of the light-emitting components to obtain the display panel.

8. The manufacturing method of the display panel of claim 7, wherein after the frame is attached to the light-emitting substrate, edges of the first barrier wall, the second barrier wall, and the substrate are cut so that the outer surface of the frame is flush with a side surface of the substrate.

9. A manufacturing method of the display panel of claim 1, wherein the manufacturing method comprises:

providing a light-emitting substrate and an encapsulating film material, wherein the light-emitting substrate comprises the substrate and the light-emitting components disposed on the substrate; the encapsulating film material comprises a base material, the frame disposed on the base material, and the encapsulant disposed on the base material; the encapsulant is disposed at an inside of the frame and connected to an inner surface of the frame; and attaching the encapsulating film material to the light-emitting substrate to position the frame at the periphery around the light-emitting components and place the first barrier wall between the second barrier wall and the substrate; and encapsulating the light-emitting components to obtain the display panel by allowing the encapsulant to deform upon contact with the light-emitting components.

10. The manufacturing method of the display panel of claim 9, wherein after the frame is attached to the light-emitting substrate, edges of the first barrier wall, the second barrier wall, and the substrate are cut so that the outer surface of the frame is flush with a side surface of the substrate.

11. The manufacturing method of the display panel of claim 9, wherein a material of the base material comprises PET.

12. A splicing display screen, comprising at least two display panels spliced together, wherein each of the at least two display panels comprises:

a substrate;

light-emitting components, disposed on the substrate;

a frame, disposed on the substrate and located at a periphery around the light-emitting components; and an encapsulant, disposed to cover outer surfaces of the light-emitting components;

wherein the frame comprises a first barrier wall and a second barrier wall sequentially stacked in a direction from the substrate to the light-emitting components, and a transmittance of the second barrier wall is greater than a transmittance of the first barrier wall, and wherein the transmittance of the second barrier wall is less than or equal to a transmittance of the encapsulant.

13. The splicing display screen according to claim 12, wherein a height of the first barrier wall is greater than a height of each of the light-emitting components.

14. The splicing display screen according to claim 12, wherein a height of the first barrier wall is greater than a height of the second barrier wall.

15. The splicing display screen according to claim 12, wherein the frame comprises an upper surface and a lower surface opposite to the upper surface, and the frame further comprises an inner surface and an outer surface opposite to the inner surface; and the frame is connected to the substrate through the lower surface, the inner surface of the frame is disposed towards the light-emitting components, and the outer surface of the frame is flush with a side surface of the substrate.

16. The splicing display screen according to claim 12, wherein the encapsulant comprises at least one selected from a group consisting of epoxy resin, silicone rubber resin, epoxy modified silicone rubber resin, silicone rubber modified epoxy resin, polyurethane, and polyvinyl acetate.

17. The splicing display screen according to claim 12, further comprising a base material, wherein the base material is disposed at a side of the frame and a side of the encapsulant facing away from the substrate; and the frame and the encapsulant are connected to the base material.

18. The splicing display screen according to claim 12, wherein after the frame is attached to the light-emitting substrate, edges of the first barrier wall, the second barrier wall, and the substrate are cut so that the outer surface of the frame is flush with a side surface of the substrate.

* * * * *